United States Patent
Paker

(10) Patent No.: US 9,509,533 B2
(45) Date of Patent: Nov. 29, 2016

(54) METHOD PERFORMED BY A SPHERE DECODER BASED TURBO EQUALIZER

(71) Applicant: Telefonaktiebolaget L M Ericsson (publ), Stockholm (SE)

(72) Inventor: Özgün Paker, Eindhoven (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/893,230

(22) PCT Filed: May 23, 2014

(86) PCT No.: PCT/EP2014/060602
§ 371 (c)(1),
(2) Date: Nov. 23, 2015

(87) PCT Pub. No.: WO2014/187931
PCT Pub. Date: Nov. 27, 2014

(65) Prior Publication Data
US 2016/0112220 A1    Apr. 21, 2016

(30) Foreign Application Priority Data
May 24, 2013 (EP) ..................... 13169170

(51) Int. Cl.
*H04L 25/03* (2006.01)
*H04L 27/34* (2006.01)
*H03M 13/25* (2006.01)

(52) U.S. Cl.
CPC ... *H04L 25/03242* (2013.01); *H04L 25/03286* (2013.01); *H04L 25/03318* (2013.01); *H04L27/3416* (2013.01); *H03M 13/258* (2013.01); *H04L 2025/03426* (2013.01); *H04L 2025/03611* (2013.01)

(58) Field of Classification Search
CPC ... H04L 1/0631; H04L 1/0054; H04L 27/34; H04L 2025/0342; H04L 1/006; H04L 27/38; H04L 2201/06; H03M 13/37; H03M 13/258; H03M 13/41; H03M 13/4146; G11B 2020/1863
See application file for complete search history.

(56) References Cited

U.S. PATENT DOCUMENTS 8,681,901 B2 *  3/2014  Yang ................. H04L 27/06
                                                    375/259
8,699,599 B2 *  4/2014  Eckert ............. H04L 25/03242
                                                    375/261

(Continued)

OTHER PUBLICATIONS

Paker, O., et al., "A Low Cost Multi-standard Near-Optimal Soft-Output Sphere Decoder: Algorithm and Architecture", Design, Automation & Test in Europe Conference & Exhibition, Mar. 8, 2010, pp. 1402-1407, IEEE.

(Continued)

*Primary Examiner* — Jean B Corrielus
(74) *Attorney, Agent, or Firm* — Coats & Bennett, PLLC

(57) ABSTRACT

A sphere decoder based turbo equalizer is described. A method comprises assorting in a first vector Quadrature Amplitude Modulation, QAM, symbols on a particular tree level based on first distance properties, assorting in a second vector QAM symbols on the particular tree level based on second distance properties, selecting the QAM symbol with the minimum second distance property in the second vector, wherein said selecting comprises labeling the selected QAM symbol as protected, identifying the selected QAM symbol in the first vector assorted by distance properties, pruning the first vector by eliminating all QAM symbols having a larger first distance property compared to the selected QAM symbol, wherein said pruning is restricted to QAM symbols not being labeled as protected, and repeating the steps d-e selecting the QAM symbol with the next minimum second distance property.

13 Claims, 7 Drawing Sheets

(56) References Cited

U.S. PATENT DOCUMENTS

| | | | | |
|---|---|---|---|---|
| 2005/0008091 A1* | 1/2005 | Boutros | ................ | H04L 1/0631 375/267 |
| 2005/0135498 A1* | 6/2005 | Yee | ....................... | H04L 1/0631 375/267 |
| 2006/0056550 A1* | 3/2006 | Skraparlis | ............. | H04L 1/0631 375/347 |
| 2006/0146965 A1* | 7/2006 | Kwun | ..................... | H04B 7/08 375/341 |
| 2007/0286313 A1* | 12/2007 | Nikopour-Deilami | .. | H04L 1/005 375/341 |
| 2008/0310556 A1* | 12/2008 | Lee | ...................... | H04L 25/067 375/340 |

OTHER PUBLICATIONS

Nikitopoulos, K., et al., "Complexity-Efficient Enumeration Techniques for Soft-Input, Soft-Output Sphere Decoding", IEEE Communications Letters, Apr. 1, 2010, pp. 312-314, vol. 14, No. 4, IEEE.

Studer, C., et al., "Soft-Input Soft-Output Single Tree-Search Sphere Decoding", IEEE Transaction on Information Theory, Oct. 1, 2010, pp. 4827-4842, vol. 56, No. 10, IEEE.

Liao, C-H, et al., "Combining Orthogonalized Partial Metrics: Efficient Enumeration for Soft-Input Sphere Decoder", IEEE 20th International Symposium on Personal, Indoor and Mobile Radio Communications, Sep. 13, 2009, pp. 1287-1291, IEEE.

Park, S., et al., "Complexity-reduced iterative MAP receiver for spatial multiplexing systems", IEE Proceedings: Communications, Institution of Electrical Engineers, GB, Aug. 5, 2005, pp. 432-438, vol. 152, No. 4, IET.

Shah, M., et al., "Complexity Reduction in Interative Soft-In Soft-Out Sphere Detection", IEEE 73rd Vehicular Technology Conference (VTC Spring), May 15, 2011, pp. 1-6, IEEE.

Tomasoni, A., et al., "Low Complexity, Quasi-Optimal MIMO Detectors for Interactive Receivers", IEEE Transactions on Wireless Communications, Oct. 1, 2010, pp. 3166-3177, vol. 9, No. 10, IEEE.

* cited by examiner

METHOD PERFORMED BY A SPHERE DECODER BASED TURBO EQUALIZER

TECHNICAL FIELD

Embodiments herein relate to a method performed by a sphere decoder based turbo equalizer.

BACKGROUND

High-spectral efficiency (bps/Hz) offered by Multiple-Input-Multiple-Output (MIMO) is present in many upcoming standards such as Long Term Evolution (LTE), LTE-Advanced, Wireless Local Area Network, 802.11n (WLAN), and Worldwide Interoperability for Microwave Access (Wi-MAX), 802.16e, for implementing high data rate modes such as 100 Mbps-1 Gbps. In MIMO communication, the original data stream to be sent is broken up into multiple streams and transmitted from different antennas at the same time in the same frequency band, resulting in the mentioned high spectral efficiency. A key issue with MIMO technology is the intentional interference caused by the transmission of independent data streams at the same time in the same frequency band. A receiver using MIMO technology thus has the additional burden of separating the streams from each other to achieve this spectral-efficiency. Hence, a key function of a MIMO receiver affecting the reception performance significantly is an equalizer.

The equalizer mitigates the effects of inter-symbol interference caused by the MIMO channel, i.e. performs detection, whereas a channel decoder, such as a turbo decoder, addresses the problem of recovering data, thus actual transmitted bits, from the equalized symbols. For complexity reasons, conventional receivers traditionally address equalization and decoding separately. These conventional receivers are still inferior when it comes to error rate performance compared to equalization schemes performing equalization and channel decoding jointly. Schemes performing equalization and channel decoding jointly are known as turbo equalization. For a turbo equalizer, Single-Input-Single-Output (SISO) or MIMO based receiver, soft input/soft output MIMO detector/equalizer, scrambler/de-scrambler interleaver/de-interleaver, and a turbo decoder providing soft output need to be used in order to iteratively improve Block Error Rates (BLER). For every turbo-equalizer iteration, the performance of the receiver is improved, i.e. the BLER drops until at a point where no further improvements are possible.

For each turbo-equalizer iteration a received signal is first equalized in the detector with a-priori inputs coming from the turbo decoder, thus from a previous iteration, or zero if the current iteration is the first iteration. Second the received signal is decoded in the turbo decoder itself whilst producing new soft-outputs which may be used as a-priori input in the next iteration.

Chun-Hao Liao et al., "*Combining orthogonalized partial metrics: Efficient enumeration for soft-input sphere decoder*", IEEE 20$^{th}$ international symposium on personal, indoor and mobile radio communications (PIMRC 2009), IEEE, Piscataway, N.J., USA, 13 Sep. 2009, pages 1287-1291, XP031659905, ISBN 978-1-4244-5122-7, describes an algorithm in a sphere decoder and a modified pruning metric that is suitable for an iterative MIMO detector.

SUMMARY

Due to increasing demands there is a need for providing improved performance for MIMO transmission solving the problems mentioned above.

In embodiments herein, a method performed by a sphere decoder based turbo equalizer is provided. The method comprises assorting in a first vector QAM symbols on a particular tree level based on first distance properties and assorting in a second vector QAM symbols on the particular tree level based on second distance properties. The method further comprises selecting the QAM symbol with the minimum second distance property in the second vector, wherein said selecting comprises labeling the selected QAM symbol as protected, identifying the selected QAM symbol in the first vector assorted by first distance properties, pruning the first vector by eliminating all QAM symbols having a larger first distance property compared to the selected QAM symbol, wherein the pruning is restricted to QAM symbols not being labeled as protected. The steps of identifying and pruning are repeated, selecting the QAM symbol with the next minimum second distance property.

In other embodiments herein, the first distance properties of the QAM symbols are their determined Euclidean distance.

In other embodiments herein, the second distance properties of the QAM symbols are their a-priori distance according to a-priori information.

In other embodiments herein, the first distance properties of the QAM symbols are their a-priori distance according to a-priori information.

In other embodiments herein, the second distance properties of the QAM symbols are their determined Euclidean distance.

In other embodiments, the Euclidean distances are determined by exact Euclidean distance computation.

In other embodiments, the Euclidean distances are approximated with a look-up table.

In other embodiments, the method further comprises reduction of interference of the parent QAM symbol from the received signal.

In other aspects, a sphere decoder based turbo equalizer is provided. The sphere decoder based turbo equalizer comprises at least one processing circuit configured to assort in a first vector QAM symbols on a particular tree level based on first distance properties, assort in a second vector QAM symbols on the particular tree level based on second distance properties, select the QAM symbol with the minimum second distance property in the second vector and label the selected QAM symbol as protected, identify the selected QAM symbol in the first vector assorted by first distance properties and eliminate all QAM symbols in the first vector with a larger first distance property compared to the selected QAM symbol, restricted to QAM symbols not being labeled as protected.

In other embodiments, the first distance properties of the QAM symbols are their determined Euclidean distance.

In other embodiments, the second distance properties of the QAM symbols are their a-priori distance according to a-priori information.

In other embodiments herein, the first distance properties of the QAM symbols are their a-priori distance according to a-priori information.

In other embodiments herein, the second distance properties of the QAM symbols are their determined Euclidean distance.

In other embodiments, the sphere decoder based turbo equalizer comprises means for determining the Euclidean distances by exact Euclidean distance computation.

In other embodiments, the sphere decoder based turbo equalizer further comprises means for determining the Euclidean distances by a look-up table.

In other embodiments, a sphere decoder architecture comprising a sphere decoder based equalizer is provided.

In other embodiments, there is provided a MIMO receiver that comprises a sphere decoder architecture.

In other embodiments, there is provided a wireless communication device that comprises a MIMO receiver.

In other embodiments, there is provided a computer program that comprises instructions which, when executed on at least one processor in a wireless communication device cause the wireless communication device to carry out a method as summarized above.

In other embodiments, there is provided a carrier that comprises a computer program as summarized above, wherein the carrier is one of an electronic signal, an optical signal, a radio signal and a computer readable storage medium.

BRIEF DESCRIPTION OF THE DRAWINGS

Examples of embodiments herein are described in more detail with reference to attached drawings in which.

DETAILED DESCRIPTION

Embodiments herein will be exemplified in the following detailed non-limiting description. As part of developing embodiments herein, a problem will first be identified and discussed.

In the following, a sphere decoder based turbo equalizer providing symbol detection under a-priori constraints is according to embodiments herein exemplified.

Figure 1:
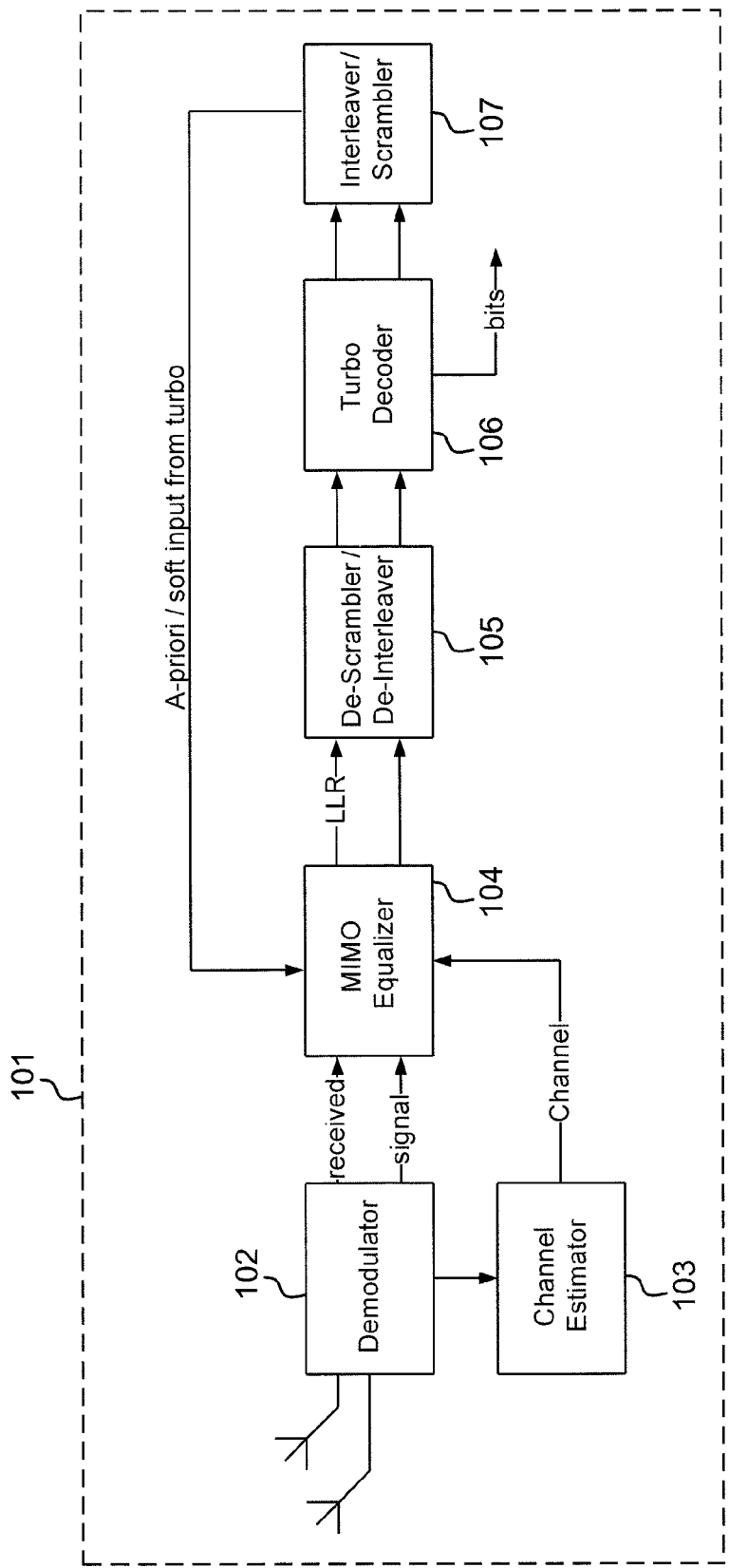
FIG. 1 shows a MIMO Receiver architecture employing a Turbo equalizer.

In FIG. 1 a MIMO Receiver architecture 101 is shown. The architecture comprises a demodulator 102, a channel estimator 103, a MIMO Equalizer 104, a De-Scrambler/De-Interleaver 105, a Turbo decoder 106 and an Interleaver/Scramber 107. The demodulator 102 transforms a RF signal to baseband, undoing the modulation performed at the transmitter. The channel estimator 103 estimates a wireless channel, the multiple channel paths from the each transmitter to each receiver antenna. The MIMO equalizer 104 having received information on the MIMO channel removes the effect of the wireless channel on the received signal, combating Inter-Symbol Interference (ISI) and MIMO interference and it produces so-called log-likelihood ratios for each received bit which are later mapped to actual hard bits e.g. 1/0 stream by the Turbo decoder 106. The interleaver/scrambler 107 block first scrambles the bit stream composing the message to be transmitted and interleaves the same bit stream, essentially changing the position of each bit randomly before transmission, to avoid the impact of burst errors at the receiver. The de-interleaver/descrambler 105 does the opposite at the receiver. The architecture employs a Turbo-equalizer. In the receiver, de-scrambling is performed before the de-interleaver. Consequently, the LLRs are passed onto the turbo decoder. Similarly, interleaving is performed before soft bits are scrambled. A sphere decoder, also referred to as a MIMO detector according to embodiments herein, providing including a-priori information in its internal log-likelihood computation will now be exemplified.

In a MIMO system, with M transmit and N receive antennas, the N dimensional received vector is given by:

$$y = H \times s + n \quad \text{Eq (1)}$$

where H denotes the channel matrix with N rows and M columns, and n represents the N dimensional additive complex Gaussian noise vector. In Eq (1), s stands for the transmitted symbol vector. Entries of s are chosen independently from a complex constellation C, e.g. from a QPSK, 16-QAM, 64-QAM complex signal constellation. The symbols are complex numbers, each mapped to a unique bit pattern. For QPSK, there are four symbols in C such as $\{-1-i, -1+i, 1-i, 1+i\}$.

Assume that the channel H is estimated at the receiver. A main task in sphere decoding is to reduce the number of candidate symbol vectors to be considered in the search to only those points that lie inside a sphere with a certain radius r around the received point y given in Eq (2).

$$d(s) = \|Y - H \times s\|^2 \prec r^2 \quad \text{Eq (2)}$$

Only imposing the constraint in Eq (2) does not lead to an efficient implementation unless Eq (2) is checked other than exhaustively searching all possible symbol vectors, which amounts to $|C|^M$ in total. For 64-QAM, 4 transmit antennas, this number is equal to $64^4$ i.e. 16,777,126 possible vectors to try. A method that enables reduced complexity is tree pruning. The matrix H may be triangularized using a QR decomposition according to H=QR where N×M matrix Q has the nice property that Q-1=QH where QH denotes hermitian transpose. R is an M×M matrix that is upper triangular i.e. elements below the diagonal are zero. Rewriting Eq (2) using QR decomposition leads to Eq (3)

$$d(s) = c + \|\hat{y} - R \times s\|^2 \prec r^2 \quad \text{Eq (3)}$$

with $\hat{y} = Q^H y$. In Eq (3), the constant c is independent of the data symbol and may be ignored in the metric computation. The squared distance $d(s) = T_1(s)$ may be computed recursively as:

$$T_i(s^i) = T_{i+1}(s^{i+1}) + \left| \hat{y} - R_{ii} s_i - \sum_{j=i+1}^{M} R_{ij} s_j \right|^2 ; i = 1, 2, \cdots M \quad \text{Eq (4)}$$

In Eq (4), $$T_{M+1}(s^{M+1}) = 0, \text{ and } s^i = [s_i s_{i+1} \cdots s_M]^T$$

it is now possible to associate all possible vectors is and the respective path metrics $T_i(s^i)$ with nodes on the i:th level of a tree, the root of which is at i=M+1. Since the second term of Eq (4) is positive, it may be concluded that whenever a path metric violates the sphere constraint given in Eq (2), the path metrics of all the children will violate Eq (2). Consequently the tree may be pruned above this node. This approach effectively reduces the number of vector symbols (i.e. leaves of the tree) to be checked. Thus, Eq (4) may be re-written as:

$$T_i(s^i) = T_{i+1}(s^{i+1}) + |b_{i+1} - R_{ii} s_i|^2 \quad \text{Eq (5)}$$

where $b_{i+1} = \hat{y} - \sum_{j=i+1}^{M} R_{ij} s_j$ the term $T_i(s^i)$ is also referred to as the Partial Euclidean Distance (PED). This metric belongs to a partial symbol vector, $s^i=[s_i s_{i+1} \ldots s_M]^T$ i.e. the path taken from the root of the tree to the ith level. Once the search is done i.e. the radius has shrinked the most, the solution i.e. the path from root to leaf that is found is the closest to the received signal vector. This solution is called the Most Likely (ML) transmitted symbol vector. The total Euclidean distance computed from root to leaf for the ML path corresponds to minimum distance for the corresponding bit pattern that makes up the ML symbol vector. In other words no other bit pattern that has the same bit value in one or more positions of the ML symbol vector may be closer to the received signal than the ML solution.

A conventional sphere decoder as explained above calculates LLRs by computing minimum distances for each bit position, in the transmitted symbol, and bit value and subtracts the minimum distances for each bit position and bit value as in Eq (6).

$$LLR(b_{i,q}) = \frac{1}{\sigma^2}\left(\min_{C_{i,q}^0} \|y - Hs\|^2 - \min_{C_{i,q}^1} \|y - Hs\|^2\right) \qquad \text{Eq (6)}$$

In Eq (6), sets shown as C0(i,q), C1(i,q) are respectively showing the symbol vectors with a bit value that is either a 0 or a 1 for transmit antenna (i) and bit position (q) of a particular transmitted QAM symbol. Thus, the first part of Eq (2) is responsible for calculating minimum distance for bit value '0', and the second operand of the subtraction refers to minimum distance for bit value '1'. They are named d0(i,q) and d1(i,q). Then LLR for bit q on antenna i could be written as d0(i,q)−d1(i,q). Obviously the detector has to compute LLR for all bits i=1, ... M and q=0 ... Q Here M denotes the number of TX antennas, and Q denotes bits per QAM symbol, for 64-QAM, Q=6. Naturally, result also scaled with noise power as given in Eq 6. As can be seen Eq (6) only uses the MIMO channel (H) and the received signal vector (y) to compute those distances. If a-priori LLRs, i.e. a-priori information, for each bit are already available, e.g. from a previous iteration of turbo, or even from a previous transmission due to Hybrid-Automated-Repeat Request (HARQ), the detector also has to accumulate these values to the Euclidean distances appropriately for each bit and compute new LLRs for the channel decoder in a receiver that employs turbo-equalization. Then write one of these distance values for a symbol vector (transmitted over M transmit antennas) including a-priori information Eq (7):

$$d(s) = \|y - Hs\|^2 - \sum_{i=1}^M \sum_{q=1}^Q \log(p(s_{i,q})) \qquad \text{Eq (7)}$$

The second part of Eq (7) refers to bit probabilities in the log domain. The contributions from all the bits in the symbol vector (s) have to be considered in this new distance calculation. These may be computed from existing LLRs using the well-known logarithm given in Eq (8).

$$\log(p(x)) = -1 \times \log(1 + e^{\mp LLR(x)}) \qquad \text{Eq (8)}$$

In Eq (8), if (x) refers to a bit value of '0', then the LLR term in the exponent has a (−) sign or a (+) sign if the value refers to a bit value of '1'.

Eq (7) may be substituted in Eq (6) resulting in Eq (9) for completeness:

$$LLR(b_{i,q}) = \min_{C_{i,q}^0}\left(\frac{1}{\sigma^2}\|y - Hs\| - \log P(s)\right) - \qquad \text{Eq (9)}$$

$$\min_{C_{i,q}^1}\left(\frac{1}{\sigma^2}\|y - Hs\| - \log P(s)\right)$$

The conclusion from Eq (9) is that the sphere decoder may no longer rely on the MIMO channel (H) and the received signal (y) to calculate LLRs but also has to consider a-priori information that changes every turbo equalizer iteration, iterations that involve the loop between the Turbo decoder and the MIMO detector. This means the candidate symbol vectors the sphere decoder computes in the first iteration by only considering the MIMO channel may not be valid anymore after applying a-priori information according to Eq (9).

A solution would be to maintain all the combinations of symbol vectors such that all possible distances may be computed and updated accordingly. However, this is impossible to implement in silicon even for a MIMO configuration of 2×2 (2 Transmit, 2 Receive antennas). As that would mean for a 64-QAM modulations scheme (e.g. LTE), 64*64=4096 candidate symbols per subcarrier. Processing 1200 subcarriers per 0.71 microseconds would mean computing Eq (3) ~68 Billion times. Only the first part of Eq (7) accounts for 4 complex MACs, leading to an excessive requirement of 275 Giga complex MACs/sec. Leading edge vector DSPs able to handle 8 complex MACs per cycle would require a clock frequency of roughly 34 GHz per turbo equalizer iteration. This is not feasible on a programmable vector DSP, furthermore this is also not feasible in dedicated hardware, not only from a large area point of view but also from a power consumption perspective as well.

Another option is to prune the search space i.e. reduce the candidate list as much as possible as it is clear that complexity is proportional to the list size. Embodiments herein proposes sphere decoding reducing the search space significantly (~4-8 times for 64-QAM) and by that enabling a feasible dedicated MIMO detector hardware implementation to be used in the Turbo-equalizer receiver architecture.

During the forward tracing of the search tree the sphere decoder now has to select the QAM symbol with the smallest incremental overall distance given in Eq (10):

$$d(s_i) = |y_{i+1} - R_{ii} * s_i|^2 - \log P(s_i) \qquad \text{Eq (10)}$$

Y(i+1) is the received signal with reduced interference as given as b(i+1) in Eq (5). As mentioned above, computing Eq (10) for all QAM symbols leads to an algorithm with an intractable complexity as the search tree has to be expanded with all possible branches.

Figure 2:
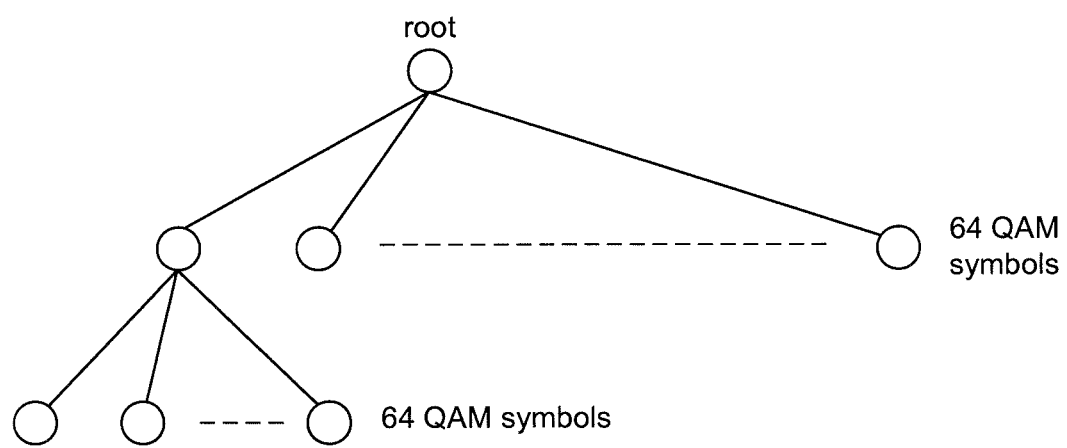
FIG. 2 shows computing for all QAM symbols at each level of a search tree.

Now turning to FIG. 2; Computing for all QAM symbols at each level of the search tree, essentially means expanding the tree fully. This is not feasible on a circuit implementation. The example shows a 64-QAM case.

Exemplified embodiments alleviating problems mentioned above may be based on the following observation: Incremental Distance calculation in equation Eq (10) comprises two parts: (i) first argument of the Eq (10) is Euclidean distance computation for a symbol vector (s), (ii) second argument of Eq (10) comprises of log probability calculation based on a-priori information for a particular QAM symbol. Re-write Eq (10) by naming Euclidean distances with dEuclidean(s) and a-priori contribution by dApriori(s). Further, get rid of the (−) sign in Eq (3) as the log(P(s)) term is always negative. The log probability term approaches 0, when s=sML, sML being the most likely QAM symbol for a particular level of the tree with probability approaching 1.

$$d(s) = d_{Euclidean}(s) + d_{A-priori}(s) \qquad \text{Eq (11)}$$

A difficulty is that when expanding the tree, it is not possible to find a QAM symbol that minimizes Eq (11) without exhaustively trying all possible symbols. The reason is that for a particular QAM symbol s, the partial Euclidean distance, essentially the first distance term i.e. dEuclidean(s) and the likelihood of that QAM symbol determined by the a-priori information delivered by the Turbo decoder, essentially the second term of equation Eq (11) could have conflicting indications. E.g. a symbol may have a small Partial Euclidean Distance but based on a-priori could have a big a-priori distance or vice versa.

In methods herein performed by a sphere decoder based turbo equalizer it is proposed to eliminate as many QAM symbols as possible. Actions described in methods herein may be performed in any suitable order. Reduction of the interference 301 of the parent QAM symbol from the received signal, i.e. compute y(i+1), may be performed. The exemplified method comprises assorting 302 in a first vector QAM symbols on a particular tree level based on their determined Euclidean distance. Assorting QAM symbols 302 on a particular tree level based on Euclidean distance may be in ascending order, i.e. start with the symbol that has the minimum PED. Assorting 303 in a second vector QAM symbols on the particular tree level based on a-priori distance according to a-priori information is performed. Assorting QAM symbols 303 on a particular tree level based on a-priori distance may be performed in ascending order, i.e. start with the symbol that has the minimum log probability, i.e. the most likely candidate according to a-priori information. Selecting 304 the QAM symbol with the minimum a-priori distance in the second vector is performed. Thus, the left-most element in the a-priori distance order is selected, i.e. the most likely candidate. Identifying 306 the selected QAM symbol in the first vector assorted by Euclidean distance is performed, thus, the location in the Euclidean order. Pruning 307 the first vector by eliminating all QAM symbols having a larger Euclidean distance compared to the selected QAM symbol is performed, i.e. in the example above eliminate all nodes that appear on the right side of the selected symbol's location in the Euclidean order. To eliminate a symbol, that symbol must not be labeled as "protected". Meanwhile label the selected node with a "protected" flag. The steps are repeated selecting the next minimum QAM symbol in the a-priori order. Simulations show that repetition 16 times in the 64-QAM case prunes ¾th of the 64 possible symbols, leaving 16 symbols (worst-case) and approximately leaves 8 symbols on average that requires further processing (step 5) i.e. 8× reduction in complexity, making it viable in hardware.

For the remaining QAM symbols, compute Eq (11) exactly i.e. PED and the corresponding a-priori distance and select the symbol with the minimum overall distance.

Performing the first step of reducing interference may be performed by exact Euclidean distance computation. However, this step may also be approximated with a look-up table. It is expected that this will not affect the performance significantly.

Figure 3:
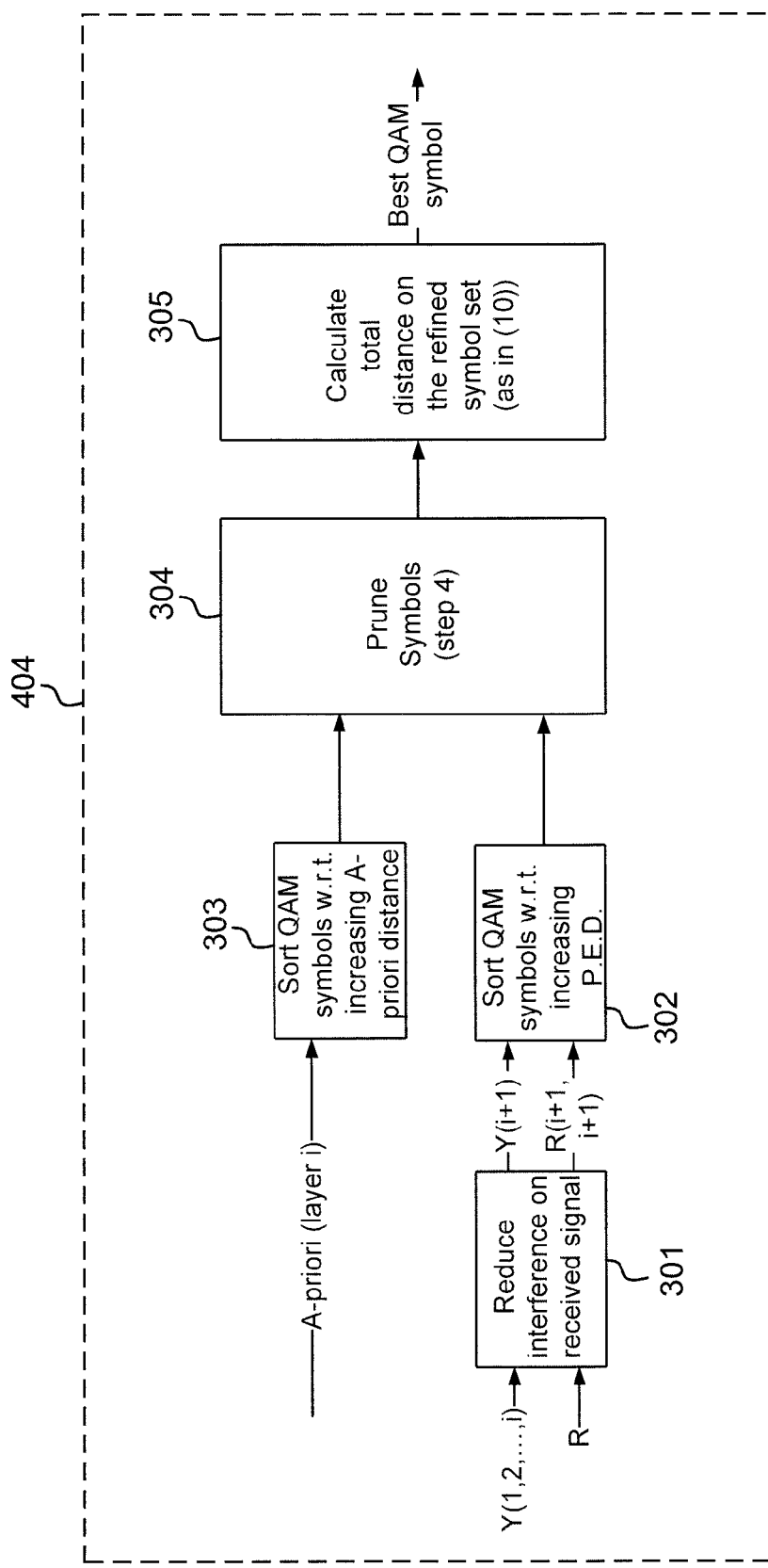
FIG. 3 shows a forward traverse unit.
Figure 5:
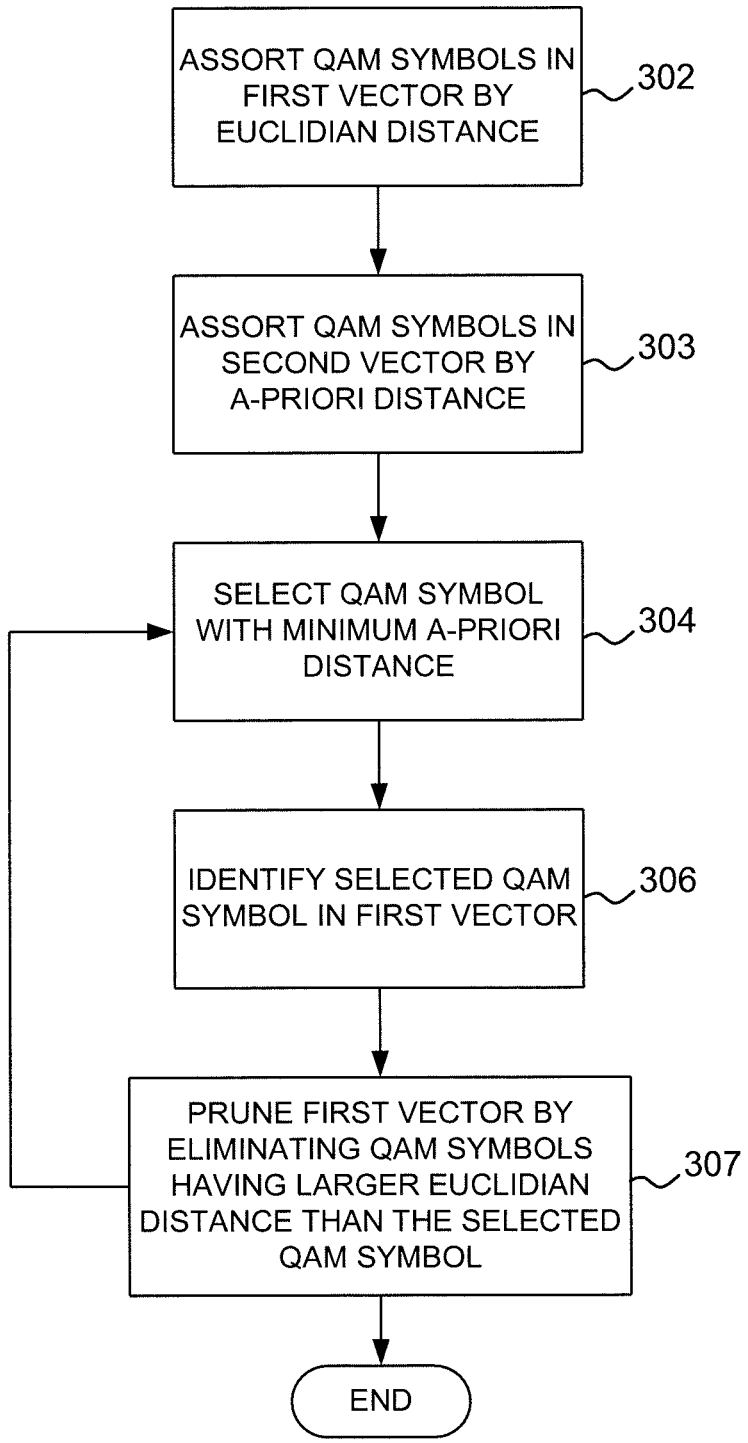
FIG. 5 shows a proposed method.

Turning now to FIGS. 3 and 5, the functional module may be named as the "Forward Traverse Unit" 404, as its task is to determine the best QAM symbol for the forward search in a sphere decoder given a-priori information from the Turbo decoder.

First, interference is removed 301 from the received signal. The sum term in equation Eq (5) actually computes this interference. Removing the interference from y(hat) gives b(i+1) in Eq (5) which is what is interesting. For convenience, all received signals in the figures are given the y label, hence, name b(i+1) of equation Eq (5) as Y(i+1) in Eq (1) and in the figure, to represent interference reduced received signal at level i+1 of the search tree.

As explained earlier, the next step is sorting of all QAM symbols based on their Euclidean distance 302, and sorting of all QAM symbols based on their A-priori distances 303. Exact Euclidean distance sorting is not feasible as that would require actual distance computations for all the 64 symbols in the 64-QAM modulation scheme per each branch of the search tree, leading to an expansion of the entire tree, similar to FIG. 2. For this step, a look-up table that approximates an exact order may be employed.

Sorting based on a-priori distance 303 may be exactly calculated as it is only needed once per Turbo-equalizer iteration, 1-2 times per codeblock, and is independent of the tree structure and hence is not dominating the complexity of the circuit alone.

After sorting QAM symbols, this unit performs pruning 307 as explained in the previous section, steps 4 and 5, the output from the pruning block is essentially the QAM symbols that could not be eliminated. For 64-QAM, simulations show worst-case 16-QAM symbols stay alive after the pruning step 307 and on average 8 symbols, indicating a complexity reduction factor of 4-8. Then exact distance calculation 305 may be performed on this refined set of symbols i.e. compute Eq (9) and pick the QAM symbol that has the minimum overall distance as the result to be passed to the next block in the sphere decoder.

Figure 4:
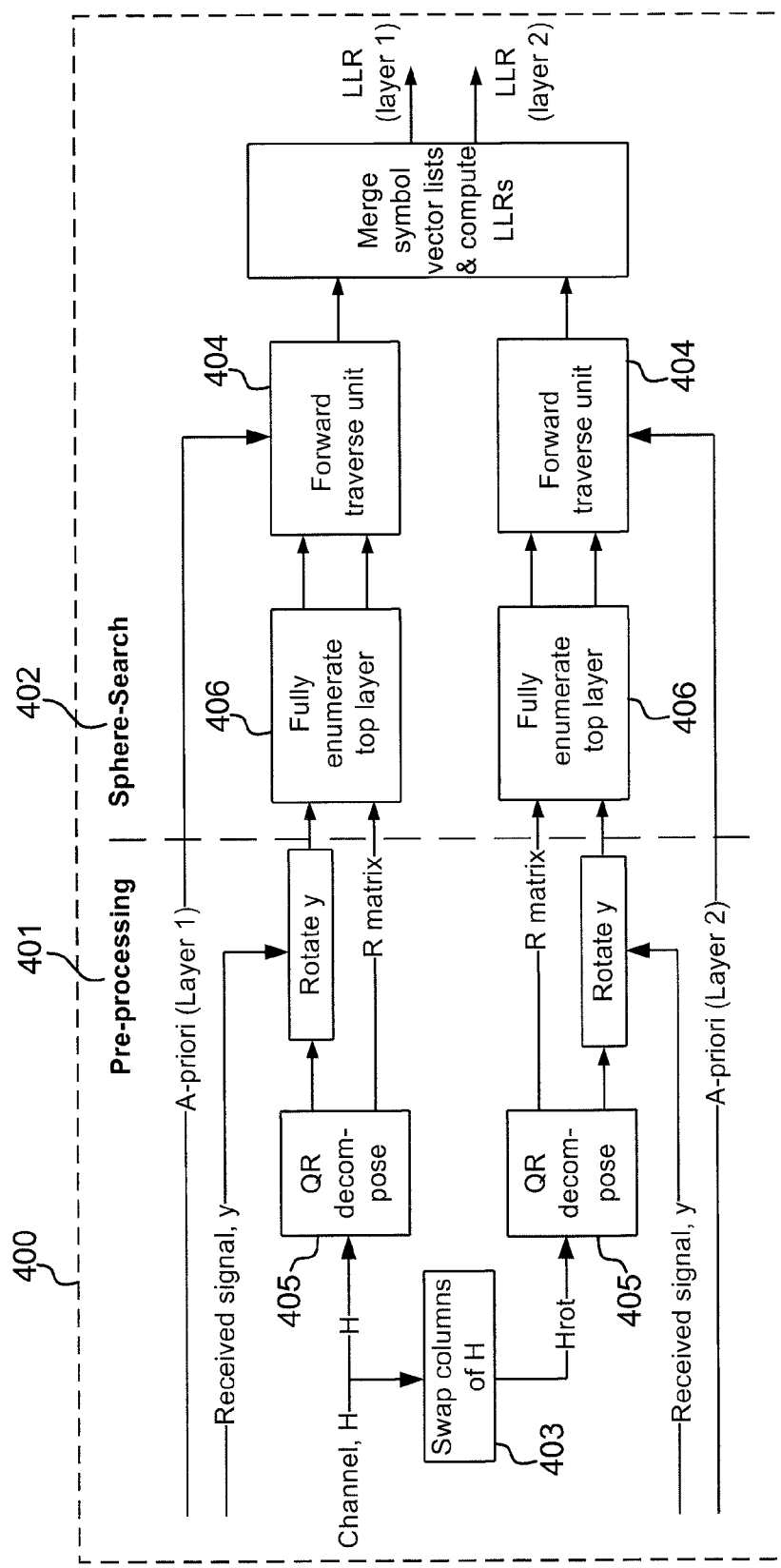
FIG. 4 shows a proposed sphere decoder.

FIG. 4 shows an example of a sphere decoder architecture 400 employing methods herein. The MIMO configuration shown here is 2×2. The SD consists of two parts: pre-processing 401 and sphere search 402. The pre-processing involves creating two channel matrices, H, and Hrot. Hrot is essentially created by swapping columns of H 403.

The QR decomposition 405 step then creates a single 2×2 search tree. Because there are two QRD steps in the decoder, two search trees are created. Swapping of the columns of H 403 makes sure that one of the trees has the spatial layers swapped as well. I.e. one tree starts with s2 as the top layer of the 2 level search tree, and the second tree starts with s1 as the top layer of the search tree. The QR decomposition produces a Q and an R matrix. (R is upper triangular with real elements in the diagonal, and Q is a unitary matrix where $Q^{-1}=Q^H$, $Q^H$ is the hermitian transpose.) In the rotate y block, the Q matrix from each search tree is multiplied with the received signal, y. The R matrix is passed on to the sphere-search stage in the sphere decoder. Pre-processing stage ends with providing the tree structures and the received signal to the search stage.

The search stage may proceed is as follow. For both trees, the top layers are fully enumerated 406. This means for 64-QAM modulation scheme, there are 64 branches at the top level/layer of the tree. As explained earlier, the "forward traverse unit" 404 selects the best QAM symbol to proceed with for each branch of a search tree. There are two FTUs as there are two search trees. Both search trees guarantee that a set of symbol vectors are provided, each symbol vector is of size 2; hence they may be called symbol pairs, that include for each bit position and each spatial layer and bit value (0 or 1) the symbol vector that has the minimum distance given a-priori delivered by Turbo decoder. Thereby, optimal behavior without exhaustively computing Eq (11) is enabled. The set of symbol vectors produced by both search trees are merged in the "merge symbol vector lists" block. If there are overlapping symbol vectors from each search tree, only one pair is considered in the final set. So mathematically the operation is a union on two sets. As for each bit position and bit value, this block has computed the minimum distances, the final step is to calculate LLR by performing the subtraction given in Eq (6).

Figure 6:
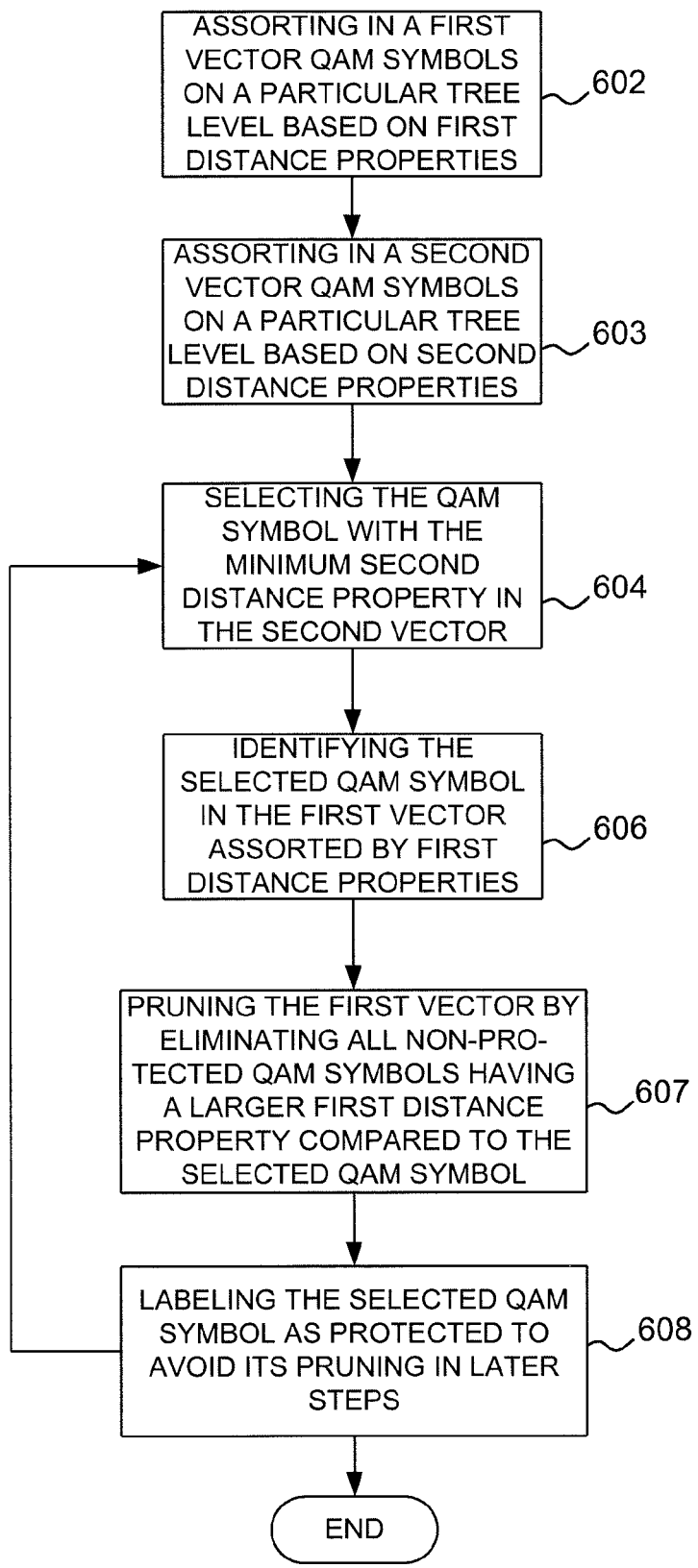
FIG. 6 shows another proposed method.

In FIG. 6, a proposed method is exemplified. The proposed method is performed by a sphere decoder based turbo equalizer. As shown in the Figure, the method comprises assorting 602 in a first vector QAM symbols on a particular tree level based on first distance properties. A next step is assorting in a second vector QAM symbols on the particular tree level based on second distance properties. Then, as a next step, the method comprises selecting 607 the QAM symbol with the minimum second distance property in the second vector. Still further, the method comprises identifying 606 the selected QAM symbol in the first vector assorted by first distance properties. Thereafter, the method comprises pruning 607 the first vector by eliminating all QAM symbols having a larger first distance property compared to the selected QAM symbol except the QAM symbols that are already labelled as "protected" in the previous steps. The selected QAM symbol 608 is labelled as "protected" to avoid being eliminated during the pruning steps in the following iterations. Last, the steps above are repeated selecting the QAM symbol with the next minimum distance property.

As mentioned above, in some embodiments, the first distance properties of the QAM symbols are their determined Euclidean distance. In some embodiments, the second distance properties of the QAM symbols are their a-priori distance according to a-priori information. In some embodiments, the first distance properties of the QAM symbols are their a-priori distance according to a-priori information. In some embodiments, the second distance properties of the QAM symbols are their determined Euclidean distance.

Methods herein enables Joint Detection based, in this case Sphere Decoder, Turbo-equalizer which has the optimal algorithmic equalizer performance better than the currently conventional MMSE-based Turbo equalizer by more than 1 dB based on simulations. Embodiments herein enable this at a complexity 4 to 8 times smaller than an exhaustive search algorithm and therefore become feasible to implement on silicon providing the performance of an exhaustive approach. That is, eliminate all nodes that appear on the right side of the selected symbol's location in the Euclidean order. To eliminate a symbol, that symbol must not be labelled as "protected". Meanwhile label the selected node with a "protected" flag. In some embodiments, algorithms such as those described in the above cited Chun Hao can be used for the residual symbols after the steps of the various embodiments described above have been carried out.

Figure 7:
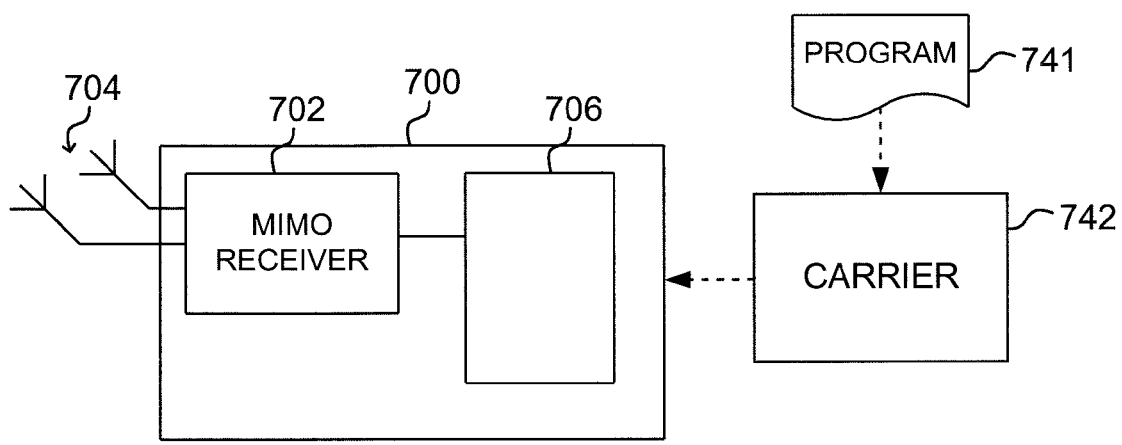
FIG. 7 shows a wireless communication device.

FIG. 7 shows a wireless communication device 700 comprising a MIMO receiver 702, e.g. a MIMO receiver that has a MIMO architecture as described above. The MIMO receiver 702 is equipped with a plurality of antennas 704 and configured such that it operates in conjunction with other circuitry, including a processor 706, in the wireless communication device 700. Needless to say, a detailed description of such other circuitry is outside the scope of the present disclosure.

The processor 706 comprises memory that contains instructions executable by the processor 706 whereby the wireless communication device 700 is operative to perform the methods as described in detail above.

The instructions that are executable by the processor 706 may be software in the form of a computer program 741. The computer program 741 may be contained in or by a carrier 742, which may provide the computer program 741 to the processor 706. The carrier 742 may be in any suitable form including an electronic signal, an optical signal, a radio signal or a computer readable storage medium.

When using the word "comprise" or "comprising" it shall be interpreted as non-limiting, in the meaning of consist at least of.

When using the word action/actions it shall be interpreted broadly and not to imply that the actions have to be carried out in the order mentioned. Instead, the actions may be carried out in any suitable order other than the order mentioned. Further, some action/actions may be optional.

The embodiments herein are not limited to the above described examples. Various alternatives, modifications and equivalents may be used. Therefore, this disclosure should not be limited to the specific form set forth herein. This disclosure is limited only by the appended claims and other embodiments than the mentioned above are equally possible within the scope of the claims.

ABBREVIATIONS

MIMO: Multiple Input Multiple Output
SISO: Single Input Single Output
LTE: Long Term Evolution
WLAN: Wireless Local Area Networks
WiMAX: Worldwide Interoperability for Microwave Access
BLER: Block Error Rates
QAM: Quadrature Amplitude Modulation
ISI: Inter-Symbol Interference
PED: Partial Euclidean Distance
ML: Most Likely
HARQ: Hybrid-Automated-Repeat Request

The invention claimed is:

1. A method performed by a sphere decoder based turbo equalizer, the method comprising:
   receiving, by a sphere decoder of the equalizer, first and second distance properties of Quadrature Amplitude Modulation (QAM) symbols on a particular tree level, wherein one of the first and second distance properties is received from a turbo decoder of the equalizer;
   sorting, in a first vector, the QAM symbols on the particular tree level based on the first distance properties;
   sorting, in a second vector, QAM symbols on the particular tree level based on the second distance properties;
   selecting a QAM symbol with the minimum second distance property out of the QAM symbols of the second vector, wherein the selecting comprises labeling the selected QAM symbol as protected;
   identifying the selected QAM symbol in the first vector sorted by the first distance properties;
   pruning the first vector by eliminating all QAM symbols having a larger first distance property compared to the selected QAM symbol, wherein the pruning is restricted to QAM symbols not being labeled as protected; and
   thereafter, selecting a second QAM symbol with the next minimum second distance property as the selected QAM symbol, and repeating the identifying and the pruning.

2. The method of claim 1, wherein one of the following is true:
   wherein the first distance properties of the QAM symbols are their determined Euclidean distance and the second distance properties of the QAM symbols are their a-priori distance according to a-priori information;
   wherein the first distance properties of the QAM symbols are their a-priori distance according to a-priori information and wherein the second distance properties of the QAM symbols are their determined Euclidean distance.

3. The method of claim 2, wherein Euclidean distances of the QAM symbols are determined by exact Euclidean distance computation.

4. The method of claim 2, wherein Euclidean distances of the QAM symbols are approximated with a look-up table.

5. The method of claim 1, further comprising, prior to the sorting in the first vector, reducing interference of a parent QAM symbol from a received signal.

6. A sphere decoder based turbo equalizer, comprising:
a turbo decoder; and
a sphere decoder configured to:
receive first and second distance properties of Quadrature Amplitude Modulation (QAM) symbols on a particular tree level, wherein one of the first and second distance properties is received from the turbo decoder;
sort, in a first vector, the QAM symbols on the particular tree level based on the first distance properties;
sort, in a second vector, QAM symbols on the particular tree level based on the second distance properties;
select a QAM symbol with the minimum second distance property in the second vector and label the selected QAM symbol as protected;
identify the selected QAM symbol in the first vector sorted by the first distance properties;
eliminate all QAM symbols in the first vector with a larger first distance property compared to the selected QAM symbol, restricted to QAM symbols not being labeled as protected; and
thereafter, selecting a second QAM symbol with the next minimum second distance property as the selected QAM symbol, and repeating the identifying and the eliminating.

7. The sphere decoder based turbo equalizer of claim 6, wherein one of the following is true:
wherein the first distance properties of the QAM symbols are their determined Euclidean distance and the second distance properties of the QAM symbols are their a-priori distance according to a-priori information;
wherein the first distance properties of the QAM symbols are their a-priori distance according to a-priori information and wherein the second distance properties of the QAM symbols are their determined Euclidean distance.

8. The sphere decoder based turbo equalizer of claim 7, wherein the sphere decoder is configured to determine the Euclidean distances by exact Euclidean distance computation.

9. The sphere decoder based turbo equalizer of claim 7, wherein the sphere decoder is configured to determine the Euclidean distances by utilizing a look-up table.

10. A sphere decoder architecture, comprising:
a sphere decoder based equalizer, the sphere decoder based equalizer comprising a sphere decoder and a turbo decoder; and
wherein the sphere decoder is configured to:
receive first and second distance properties of Quadrature Amplitude Modulation (QAM) symbols on a particular tree level, wherein one of the first and second distance properties is received from the turbo decoder;
sort, in a first vector, the QAM symbols on the particular tree level based on the first distance properties;
sort, in a second vector, QAM symbols on the particular tree level based on the second distance properties;
select a QAM symbol with the minimum second distance property in the second vector and label the selected QAM symbol as protected;
identify the selected QAM symbol in the first vector sorted by the first distance properties;
eliminate all QAM symbols in the first vector with a larger first distance property compared to the selected QAM symbol, restricted to QAM symbols not being labeled as protected; and
thereafter, selecting a second QAM symbol with the next minimum second distance property as the selected QAM symbol, and repeating the identifying and the eliminating.

11. A multiple input multiple output (MIMO) receiver, comprising:
a sphere decoder architecture;
wherein the sphere decoder architecture comprises a sphere decoder based equalizer, wherein the sphere decoder based equalizer comprises a sphere decoder and a turbo decoder; and
wherein the sphere decoder is configured to:
receive first and second distance properties of Quadrature Amplitude Modulation (QAM) symbols on a particular tree level, wherein one of the first and second distance properties is received from the turbo decoder;
sort, in a first vector, the QAM symbols on the particular tree level based on the first distance properties;
sort, in a second vector, QAM symbols on the particular tree level based on the second distance properties;
select a QAM symbol with the minimum second distance property in the second vector and label the selected QAM symbol as protected;
identify the selected QAM symbol in the first vector sorted by the first distance properties;
eliminate all QAM symbols in the first vector with a larger first distance property compared to the selected QAM symbol, restricted to QAM symbols not being labeled as protected; and
thereafter, selecting a second QAM symbol with the next minimum second distance property as the selected QAM symbol, and repeating the identifying and the eliminating.

12. A wireless communication device, comprising:
a MIMO receiver;
wherein the MIMO receiver comprises a sphere decoder architecture;
wherein the sphere decoder architecture comprises a sphere decoder based equalizer, wherein the sphere decoder based equalizer comprises a sphere decoder and a turbo decoder; and
wherein the sphere decoder is configured to:
receive first and second distance properties of Quadrature Amplitude Modulation (QAM) symbols on a particular tree level, wherein one of the first and second distance properties is received from the turbo decoder;
sort, in a first vector, the QAM symbols on the particular tree level based on the first distance properties;

sort, in a second vector, QAM symbols on the particular tree level based on the second distance properties;

select a QAM symbol with the minimum second distance property in the second vector and label the selected QAM symbol as protected;

identify the selected QAM symbol in the first vector sorted by the first distance properties;

eliminate all QAM symbols in the first vector with a larger first distance property compared to the selected QAM symbol, restricted to QAM symbols not being labeled as protected; and thereafter, selecting a second QAM symbol with the next minimum second distance property as the selected QAM symbol, and repeating the identifying and the eliminating.

13. A computer program product stored in a non-transitory computer readable medium for controlling a sphere decoder based turbo equalizer, the computer program product comprising software instructions which, when run on at least one processing circuit of a wireless communication device, causes the wireless communication device to:

receive, by a sphere decoder of the equalizer, first and second distance properties of Quadrature Amplitude Modulation (QAM) symbols on a particular tree level, wherein one of the first and second distance properties is received from a turbo decoder of the equalizer;

sort, in a first vector, the QAM symbols on the particular tree level based on the first distance properties;

sort, in a second vector, QAM symbols on the particular tree level based on the second distance properties;

select a QAM symbol with the minimum second distance property out of the QAM symbols of the second vector, wherein the selecting comprises labeling the selected QAM symbol as protected;

identify the selected QAM symbol in the first vector sorted by the first distance properties;

prune the first vector by eliminating all QAM symbols having a larger first distance property compared to the selected QAM symbol, wherein the pruning is restricted to QAM symbols not being labeled as protected; and thereafter, select a second QAM symbol with the next minimum second distance property as the selected QAM symbol, and repeat the identifying and the pruning.

* * * * *